United States Patent
Chen (10) Patent No.: US 8,514,015 B2
(45) Date of Patent: Aug. 20, 2013

(54) AMPLIFIER WITH PROGRAMMABLE OFF VOLTAGE

(75) Inventor: Minghui Chen, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 40 days.

(21) Appl. No.: 12/332,194

(22) Filed: Dec. 10, 2008

(65) Prior Publication Data
US 2010/0141337 A1    Jun. 10, 2010

(51) Int. Cl.
H03F 1/14 (2006.01)
(52) U.S. Cl.
USPC ............................................ 330/51; 330/311
(58) Field of Classification Search
USPC .................................................. 330/51, 311
See application file for complete search history.

(56) References Cited

U.S. PATENT DOCUMENTS

| | | | |
|---|---|---|---|
| 4,598,252 A * | 7/1986 | Andricos | 330/51 |
| 5,726,982 A | 3/1998 | Witter | |
| 6,400,227 B1 | 6/2002 | Goldfarb et al. | |
| 6,594,318 B1 | 7/2003 | Sindhushayana | |
| 6,650,694 B1 | 11/2003 | Brown et al. | |
| 6,792,031 B1 | 9/2004 | Sriram et al. | |
| 6,888,410 B1 | 5/2005 | Li et al. | |
| 6,987,778 B2 | 1/2006 | Sindhushayana et al. | |
| 7,051,268 B1 | 5/2006 | Sindhushayana et al. | |
| 7,109,801 B2 | 9/2006 | Li et al. | |
| 7,120,411 B2 * | 10/2006 | Darabi | 455/240.1 |
| 7,321,266 B2 | 1/2008 | Chiang | |
| 2003/0053435 A1 | 3/2003 | Sindhushayana et al. | |
| 2004/0151122 A1 | 8/2004 | Lau et al. | |
| 2006/0062298 A1 | 3/2006 | Park et al. | |
| 2006/0119435 A1 | 6/2006 | Oh et al. | |
| 2006/0202751 A1* | 9/2006 | Stephelbauer et al. | 330/51 |
| 2006/0268880 A1 | 11/2006 | Zhao et al. | |
| 2007/0160164 A1 | 7/2007 | Sahota | |
| 2008/0036532 A1 | 2/2008 | Pan et al. | |

FOREIGN PATENT DOCUMENTS

| | | |
|---|---|---|
| EP | 1404136 A1 | 3/2004 |
| EP | 1429487 A2 | 6/2004 |
| EP | 1837989 A1 | 9/2007 |

(Continued)

OTHER PUBLICATIONS

International Search Report-PCT/US2009/067576—International Search Authority—European Patent Office, Apr. 27, 2010.

(Continued)

*Primary Examiner* — Robert Pascal
*Assistant Examiner* — Khiem Nguyen
(74) *Attorney, Agent, or Firm* — Ramin Mobarhan (57) ABSTRACT

An amplifier with multiple stages and having improved reliability is described. The multiple amplifier stages are coupled in parallel and include at least one switchable amplifier stage. Each switchable amplifier stage may be operated in an on state or an off state and includes a gain transistor and a cascode transistor. The gain transistor amplifies an input signal and provides an amplified signal in the on state and is disabled in the off state. The cascode transistor buffers the amplified signal and provides an output signal in the on state and is disabled based on an off voltage in the off state. The off voltage may be greater than zero volts or may have one of multiple possible values. The off voltage may be generated based on an output signal level, e.g., may be set to different values for different ranges of output signal level.

25 Claims, 6 Drawing Sheets

(56) References Cited

FOREIGN PATENT DOCUMENTS

| | | |
|---|---|---|
| JP | 2005312016 A | 11/2005 |
| JP | 2007235525 A | 9/2007 |
| JP | 2007269297 A | 10/2007 |
| JP | 2008227667 A | 9/2008 |
| KR | 861897 | 9/2008 |
| TW | 200611489 A | 4/2006 |
| TW | 200618458 A | 6/2006 |
| TW | 200713798 | 4/2007 |
| WO | WO0059123 | 10/2000 |
| WO | WO0230000 | 4/2002 |
| WO | WO2004049661 A1 | 6/2004 |
| WO | WO2008145604 A1 | 12/2008 |

OTHER PUBLICATIONS

ITU-T Recommendation H.264, Advanced Video Coding for Generic Audiovisual Services. Section 8.4. Mar. 2005.

Pang K. K. et al.: "Optimum Loop Filter in Hybrid Coders" IEEE Transaction on Circuits and Systems for Video Technology, IEEE Service Center, Piscataway, NJ, US, vol. 4, No. 2, Apr. 1, 1994, pp. 158-167, XP000489688, ISSN: 1051-8215.

Thomas, Wiegand et al., "Joint Draft 7 of SVC Amendment (revision 2)", JVT-T201r2, Jul. 2006, Klagenfurt, Austria.

TIA-1099 Standard "Forward Link Only Air Interface Specificaiton for Terrestrial Mobile Multimedia Multicast" pp. 1-341, Mar. 2007.

W.-J. Han: "Smoothed reference prediction for single-loop decoding" Video Standards And Drafts, No. JVT-P085, 16th Meeting, Poznan, PL, Jul. 24-29, 2005, XP030006122.

Woo-Jin Han: "Modified IntraBL Design Using Smoothed Reference." JVT-R091r1. Jan. 2006, Bangkok, Thailand.

Yey Ye; Bao Y.: "Complexity Reduction for Smoothed Reference used in Spatial Scalability" Video Standards And Drafts, No. JVT-U126rl, 21st Meeting: Hangzhou, China, Dec. 20-27, 2006, XP030006772.

Schwarz H. et al.: "Constrained Inter-Layer Prediction for Single-Loop Decoding in Spatial Scalability" Image Processing, 2005. ICIP 2005. IEEE International Conference on Genova, Italy Sep. 11-14, 2005, Piscataway, NJ, USA, IEEE, vol. 2, pp. 870-873, X.

Taiwan Search Report—TW098142419—TIPO—Oct. 8, 2012.

Written Opinion—PCT/US2009/067576—ISA/EPO—Apr. 27, 2010.

* cited by examiner

AMPLIFIER WITH PROGRAMMABLE OFF VOLTAGE

BACKGROUND

I. Field

The present disclosure relates generally to electronics, and more specifically to an amplifier.

II. Background

Amplifiers are commonly used in various electronics devices to provide signal amplification. Different types of amplifiers are available for different uses. For example, a wireless communication device such as a cellular phone may include a transmitter and a receiver for bi-directional communication. The transmitter may utilize a driver amplifier (DA) and a power amplifier (PA), the receiver may utilize a low noise amplifier (LNA), and the transmitter and receiver may utilize variable gain amplifiers (VGAs).

Sub-micron complementary metal oxide semiconductor (CMOS) fabrication processes are commonly used for radio frequency (RF) circuits in wireless devices and other electronics devices in order to reduce cost and improve integration. However, transistors fabricated in sub-micron CMOS processes typically have small physical dimensions and are more susceptible to stress due to large signal swing. The stress may adversely impact the reliability of amplifiers implemented with these transistors. An amplifier with good performance and good reliability is highly desirable.

DETAILED DESCRIPTION

The word "exemplary" is used herein to mean "serving as an example, instance, or illustration." Any design described herein as "exemplary" is not necessarily to be construed as preferred or advantageous over other designs.

An amplifier having good performance and improved reliability is described herein. The amplifier may be used for various electronics devices such as wireless communication devices, cellular phones, personal digital assistants (PDAs), handheld devices, wireless modems, laptop computers, cordless phones, broadcast receivers, Bluetooth devices, consumer electronics devices, etc. For clarity, the use of the amplifier in a wireless device, which may be a cellular phone or some other device, is described below.

Figure 1:
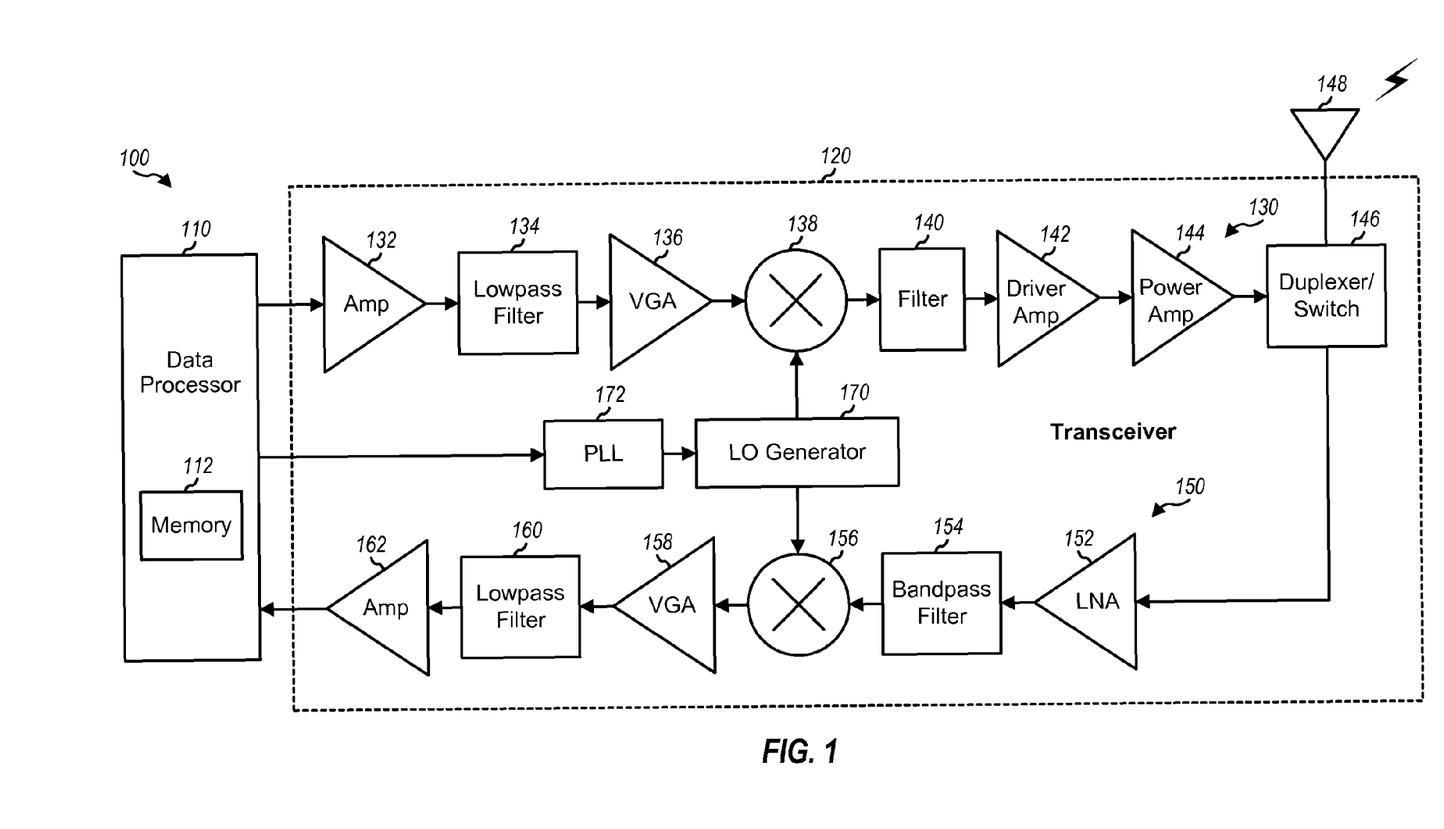
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 150 that support bi-directional wireless communication. In general, wireless device 100 may include any number of transmitters and any number of receivers for any number of communication systems and any number of frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a VGA 136, and upconverted from baseband to RF by a mixer 138. The upconverted signal is filtered by a filter 140 to remove images caused by the frequency upconversion, further amplified by a driver amplifier (DA) 142 and a power amplifier (PA) 144, routed through a duplexer/switch 146, and transmitted via an antenna 148.

In the receive path, antenna 148 receives signals from base stations and provides a received signal, which is routed through duplexer/switch 146 and provided to receiver 150. Within receiver 150, the received signal is amplified by an LNA 152, filtered by a bandpass filter 154, and downconverted from RF to baseband by a mixer 156. The downconverted signal is amplified by a VGA 158, filtered by a lowpass filter 160, and amplified by an amplifier 162 to obtain an analog input signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a super-heterodyne architecture, which frequency converts a signal between RF and baseband in multiple stages. A local oscillator (LO) generator 170 generates and provides transmit and receive LO signals to mixers 138 and 156, respectively. A phase locked loop (PLL) 172 receives control information from data processor 110 and provides control signals to LO generator 170 to generate the transmit and receive LO signals at the proper frequencies.

FIG. 1 shows an exemplary transceiver design. In general, the conditioning of the signals in transmitter 130 and receiver 150 may be performed by one or more stages of amplifier, filter, mixer, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of transceiver 120 may be implemented on an analog integrated circuit (IC), an RF IC (RFIC), a mixed-signal IC, etc. For example, amplifier 132 through driver amplifier 142 in transmitter 130 may be implemented on an RFIC whereas power amplifier 144 may be implemented external to the RFIC.

Data processor 110 may perform various functions for wireless device 100, e.g., processing for transmitted and received data. A memory 112 may store program codes and data for data processor 110. Data processor 110 may be implemented on one or more application specific integrated circuits (ASICs) and/or other ICs.

As shown in FIG. 1, a transmitter and a receiver may include various amplifiers. Each amplifier may be implemented in various manners.

Figure 2:
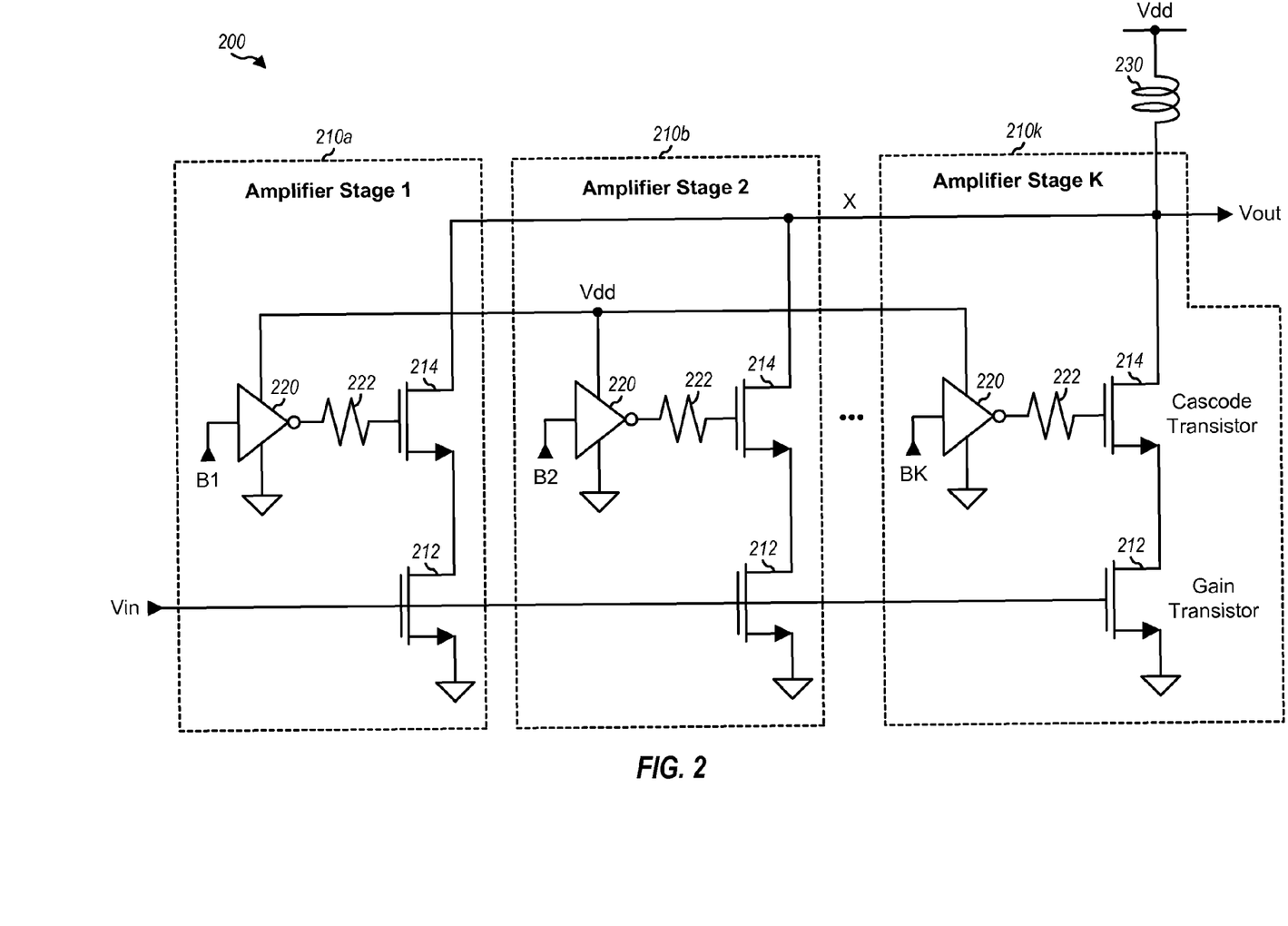
FIG. 2 shows a schematic diagram of an amplifier.

FIG. 2 shows a schematic diagram of an amplifier 200 that may be used for DA 142, PA 144, LNA 152, VGAs 136 and 158, and/or other amplifiers in FIG. 1. Amplifier 200 includes K amplifier stages 210a through 210k coupled in parallel, where K may be any integer value. The amplifier stages may also be referred to as branches, etc. Within each amplifier stage 210, an N-channel metal oxide semiconductor (NMOS) transistor 212 has its source coupled to circuit ground and its gate receiving an input signal, Vin. The terms "transistor" and "device" are often used interchangeably. An NMOS transistor 214 has its source coupled to the drain of NMOS transistor 212 and its drain coupled to node X, which provides an output signal, Vout. NMOS transistor 212 is a gain transistor that receives the Vin signal at its gate, amplifies the Vin signal, and provides an amplified signal at its drain. NMOS transistor 214 is a cascode transistor that has its gate coupled to AC ground. NMOS transistor 214 receives the amplified signal at its source and provides the Vout signal at its drain.

An inverter 220 has its input receiving a Bk control signal and its output providing a control voltage for NMOS transistor 214, where $k \in \{1, \ldots, K\}$. Inverter 220 may be implemented with a P-channel MOS (PMOS) transistor and an NMOS transistor having their gates coupled together and forming the inverter input and their drains coupled together and forming the inverter output. The source of the PMOS transistor may be coupled to a power supply, Vdd, and the source of the NMOS transistor may be coupled to circuit ground, as shown in FIG. 2. A resistor 222 is coupled between the output of inverter 220 and the gate of NMOS transistor 214.

An inductor 230 is coupled between node X and the Vdd supply voltage. Inductor 230 provides bias current for NMOS transistors 212 and 214 in all enabled amplifier stages. Inductor 230 may also be used for output impedance matching.

Each of the K amplifier stages 210a through 210k may be individually enabled or disabled via a respective Bk control signal. For the k-th amplifier stage, when the Bk control signal is at logic low, inverter 220 provides Vdd at its output, NMOS transistor 214 is turned on, and the amplifier stage is enabled. Conversely, when the Bk control signal is at logic high, inverter 220 provides 0 volts (V) at its output, NMOS transistor 214 is turned off, and the amplifier stage is disabled. Each amplifier stage provides signal gain when enabled. The K amplifier stages 210a through 210k may provide equal amount of gain (e.g., with the same transistor sizes for all K amplifier stages) or may provide different amounts of gain (e.g., with different transistor sizes for the K amplifier stages). For example, NMOS transistors 212 and 214 in amplifier stage 1 may be twice the size (and gain) of NMOS transistors 212 and 214 in amplifier stage 2, which may be twice the size of NMOS transistors 212 and 214 in the next amplifier stage, etc. The desired overall gain for amplifier 200 may be obtained by enabling the proper amplifier stage(s). The output signal level may be dependent on (e.g., may be proportional to) the overall gain of amplifier 200.

Amplifier 200 operates as follows. For each amplifier stage that is enabled, NMOS transistor 212 amplifies the Vin signal and provides an amplified signal. NMOS transistor 212 also performs voltage-to-current conversion. NMOS transistor 214 buffers the amplified signal, provides a current gain of one, and provides signal drive for the Vout signal. Resistor 222 is an RF blocking resistor that blocks the RF signal component in the Vout signal at the gate of NMOS transistor 214.

Amplifier 200 is implemented with an open drain architecture, which is commonly used for a driver amplifier in a wireless transmitter. Amplifier 200 employs inductor 230 coupled between the Vdd supply voltage and cascode transistors 214 in all K amplifier stages 210a through 210k. Inductor 230 allows the Vout signal to swing above the Vdd voltage, which may be beneficial to obtain a higher 1 decibel (dB) compression point as well as better adjacent channel leakage rejection (ACLR) and adjacent channel power rejection (ACPR) performance for amplifier 200. However, the larger Vout signal swing may also pose a risk to the reliability of cascode transistors 214. When the Vout signal is above Vdd, cascode transistors 214 in all K amplifier stages 210 may observe a large voltage, which may stress these cascode transistors.

For each amplifier stage 210 that is enabled, the voltage swing of the Vout signal may be split across cascode transistor 214 and gain transistor 212 by applying Vdd to the gate of each enabled cascode transistor. However, most of the stress due to the larger Vout signal swing occurs when cascode transistor 214 is turned off, e.g., by automatic gain control (AGC) when a smaller output signal level is desired. Cascode transistor 214 is still connected to output node X even when it is turned off and would then observe the Vout signal at its drain. In the off state, the gate of cascode transistor 214 is pulled to ground via inverter 220, and the source of cascode transistor 214 is also pulled to ground via gain transistor 212, which operates as a switch. In the off state, the drain-to-source voltage, Vds, as well as the drain-to-gate voltage, Vdg, of cascode transistor 214 may be larger than Vdd (e.g., up to twice Vdd) and may exceed the rated device voltages. The large Vds and Vdg voltages may stress cascode transistor 214 and may adversely affect the reliability and lifetime of the transistor. The stress may be especially severe when amplifier 200 is operating at high gain/high output power and an amplifier stage is disabled to reduce the gain. The cascode transistor in this disabled amplifier stage may observe large Vds and Vdg voltages, which may be well above Vdd.

Figure 3:
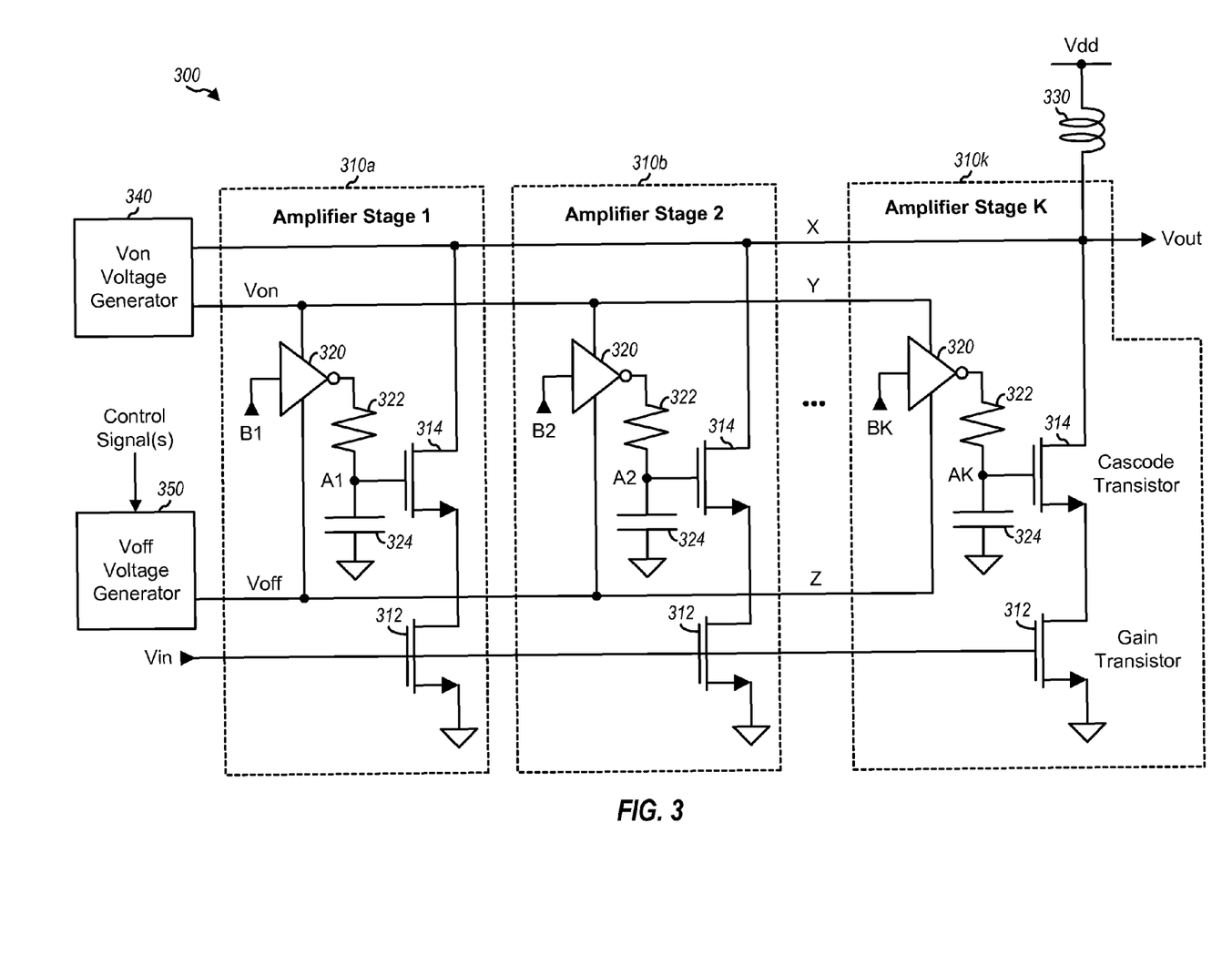
FIG. 3 shows a schematic diagram of an amplifier with improved reliability.

FIG. 3 shows a schematic diagram of an exemplary design of an amplifier 300 with programmable off voltage for improved reliability. Amplifier 300 may be used for DA 142, PA 144, LNA 152, VGAs 136 and 158, and/or other amplifiers in FIG. 1. Amplifier 300 includes K amplifier stages 310a through 310k coupled in parallel. Within each amplifier stage 310, an NMOS transistor 312 has its source coupled to circuit ground and its gate receiving a Vin signal. An NMOS transistor 314 has its source coupled to the drain of NMOS transistor 312, its gate coupled to node Ak, with $k \in \{1, \ldots, K\}$, and its drain coupled to node X. An inverter 320 has its input receiving a Bk control signal, its upper supply node coupled to node Y, and its lower supply node coupled to node Z. A resistor 322 is coupled between the output of inverter 320 and node Ak. A capacitor 324 is coupled between node Ak and circuit ground. Inverter 320 may also be replaced with a buffer composed of multiple (e.g., two) inverters coupled in cascade. The Bk control signal may have different polarity depending on whether an inverter or a buffer is used in amplifier stage 310.

An inductor 330 is coupled between the Vdd power supply and node X, which provides a Vout signal. A Von voltage generator 340 provides an on voltage, Von, to node Y and may be implemented with resistors, capacitors, transistors, etc. The Von voltage may be equal to Vdd or a fraction of Vdd. The Von voltage may be selected to provide the desired voltage drop across cascode transistor 314 and gain transistor 312 when the amplifier stage is enabled. Von voltage generator 340 may also be omitted, and node Y may be coupled directly to the Vdd power supply. A Voff voltage generator 350 provides an off voltage, Voff, to node Z and may be implemented as described below. Another voltage generator not shown in FIG. 3 may generate a bias voltage for the gate of NMOS transistors 312 in all K amplifier stages 310.

Each of the K amplifier stages 310a through 310k may be individually enabled or disabled via the Bk control signal for that stage. The k-th amplifier stage may be enabled by providing logic low on the Bk control signal, which results in inverter 320 providing the Von voltage via resistor 322 to the gate of NMOS transistor 314 and turning on the NMOS transistor. Conversely, the k-th amplifier stage may be disabled by providing logic high on the Bk control signal, which results in inverter 320 providing the Voff voltage via resistor 322 to the gate of NMOS transistor 314 and turning off the NMOS transistor.

Cascode amplifier 300 operates as follows. For each amplifier stage 310 that is enabled, NMOS transistor 312 operates as a gain transistor that amplifies the Vin signal. NMOS transistor 314 is enabled by the Von voltage at its gate, operates as a cascode transistor that buffers the amplified signal from NMOS transistor 312, and provides signal drive for the Vout signal. Resistor 322 is an RF blocking resistor that blocks the RF signal component in the Von voltage at the gate of NMOS transistor 314. Capacitor 324 stabilizes the gate voltage of NMOS transistor 314 to improve the gain of NMOS transistor 314. For each amplifier stage that is disabled, NMOS transistor 314 receives the Voff voltage at its gate and is turned off.

NMOS transistors 312 and 314 may be implemented with thin oxide NMOS transistors having thin gate oxide in order to obtain good RF performance. The reliability of the gate oxide of a thin oxide NMOS transistor is dependent on the Vdg voltage of the NMOS transistor when it is turned off. The lifetime of the thin oxide NMOS transistor, before rupture of the gate oxide, may be given by a time dependent dielectric breakdown (TDDB) function. The TDDB function may be modeled with an equation or may be determined via computer simulation.

Figure 4:
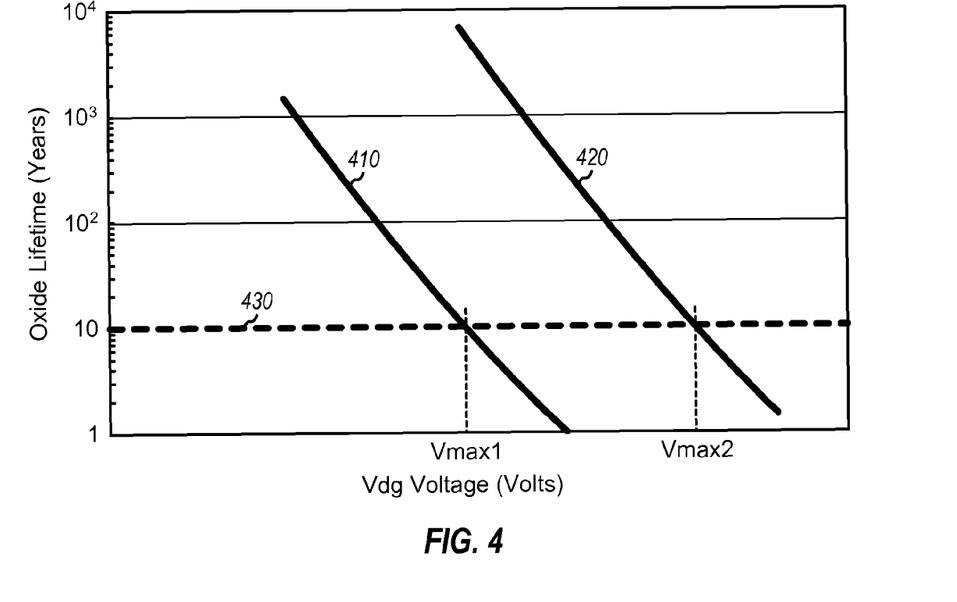
FIG. 4 shows plots of oxide lifetime versus drain-to-gate voltage (Vdg).

FIG. 4 shows plots of oxide lifetime versus Vdg voltage. The horizontal axis represents Vdg voltage and is given in linear scale. The vertical axis represents oxide lifetime and is given in logarithmic scale. A plot 410 shows oxide lifetime versus Vdg voltage for a thin oxide NMOS transistor. A plot 420 shows oxide lifetime versus Vdg voltage for a thin oxide PMOS transistor. A dashed line 430 represents a target oxide lifetime, which may be 10 years as shown in FIG. 4 or some other duration.

As shown in FIG. 4, the target oxide lifetime for an NMOS transistor may be obtained by ensuring that the Vdg voltage of the NMOS transistor is below a Vmax1 voltage. The target oxide lifetime for a PMOS transistor may be obtained by ensuring that the Vdg voltage of the PMOS transistor is below a Vmax2 voltage. Plots 410 and 420 as well as the Vmax1 and Vmax2 voltages may be dependent on various factors such as IC fabrication process, gate oxide thickness, gate oxide area, temperature, etc.

For the exemplary design shown in FIG. 3, the Vdg voltage of a disabled NMOS transistor 314 may be given as:

$$Vdg = Vout - Voff. \quad \text{Eq (1)}$$

The Vdg voltage should be less than Vmax1 to obtain the desired oxide lifetime for NMOS transistor 314. As shown in equation (1), the Vdg voltage may be reduced by increasing the Voff voltage. A higher Voff voltage may improve the oxide lifetime, which may be desirable. However, since the Voff voltage is applied to the gate of NMOS transistor 314 when it is disabled, the Voff voltage should be constrained as follows:

$$Voff < Vth, \quad \text{Eq (2)}$$

where Vth is a threshold voltage of NMOS transistor 314. A higher Voff voltage may increase leakage current through NMOS transistor 314 when it is turned off, which may be undesirable. The Voff voltage may be selected based on a tradeoff between oxide reliability and leakage current.

The Vdg voltage may be decomposed into a direct current (DC) part and an alternating current (AC) part. The DC part of the Vdg voltage may be dependent on the Voff voltage as well as the DC part of the Vout signal, which may be related to (e.g., equal to) Von. The AC part of the Vdg voltage may be dependent on the AC part of the Vout signal. A parasitic drain-to-gate capacitance, Cdg, of NMOS transistor 314 may help to maintain the Vdg voltage and to reduce the amount of coupling of the AC part of the Vout signal.

In one exemplary design, the Voff voltage may be a programmable value that may be dependent on the output signal level. A larger Voff voltage may be used for a larger output signal level, and vice versa. The larger Voff voltage may result in more leakage current. However, more current may be consumed in order to provide a larger output signal level. The higher leakage current may thus be a small percentage of the overall current at the larger output signal level. The Voff voltage may be set to 0V for low output signal level, and no leakage current would occur in this case.

Figure 5:
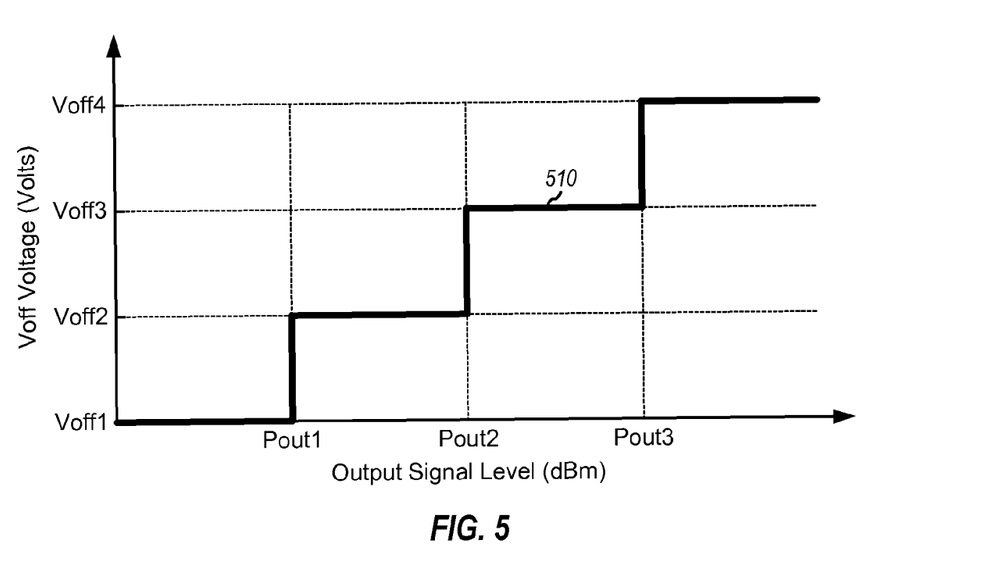
FIG. 5 shows programmable off voltage versus output signal level.

FIG. 5 shows an exemplary design of a programmable Voff voltage. The horizontal axis represents output signal level, which may be given in units of decibel relative to one milli-Watt (dBm). The vertical axis represents the Voff voltage, which may be given in units of Volts. A plot 510 shows Voff voltage versus output signal level.

In the exemplary design shown in FIG. 5, the Voff voltage may be set to one of four possible values based on four ranges of output signal level. In particular, the Voff voltage may be set to Voff1 for output signal level of Pout1 or less, to Voff2 for output signal level between Pout1 and Pout2, to Voff3 for output signal level between Pout2 and Pout3, or to Voff4 for output signal level of Pout3 or greater. Voff1 through Voff4 and Pout1 through Pout3 may be selected based on various factors such as the desired oxide reliability, the Vmax of the NMOS transistor, the required overall range of output signal level, etc. In one exemplary design, Voff1 may be equal to 0V, Voff2 may be equal to 100 milli-Volts (mV), Voff3 may be equal to 200 mV, and Voff4 may be equal to 300 mV. In one exemplary design, Pout1 may be equal to 4 dBm, Pout2 may be equal to 8 dBm, and Pout3 may be equal to 12 dBm. Voff1 through Voff4 and Pout1 through Pout3 may also be set to other values.

FIG. 5 shows an exemplary design in which the Voff voltage is set to discrete values for different ranges of output signal level. In general, any number of Voff values may be used for any number of ranges of output signal level. Any Voff value may be used for each range of output signal level. In another exemplary design, the Voff voltage may be continuously adjusted based on the output signal level. For both exemplary designs, the output signal level may be determined based on the B1 through BK control signals for the K amplifier stages 310. The B1 through BK control signals may thus be used to generate the Voff voltage.

Figure 6:
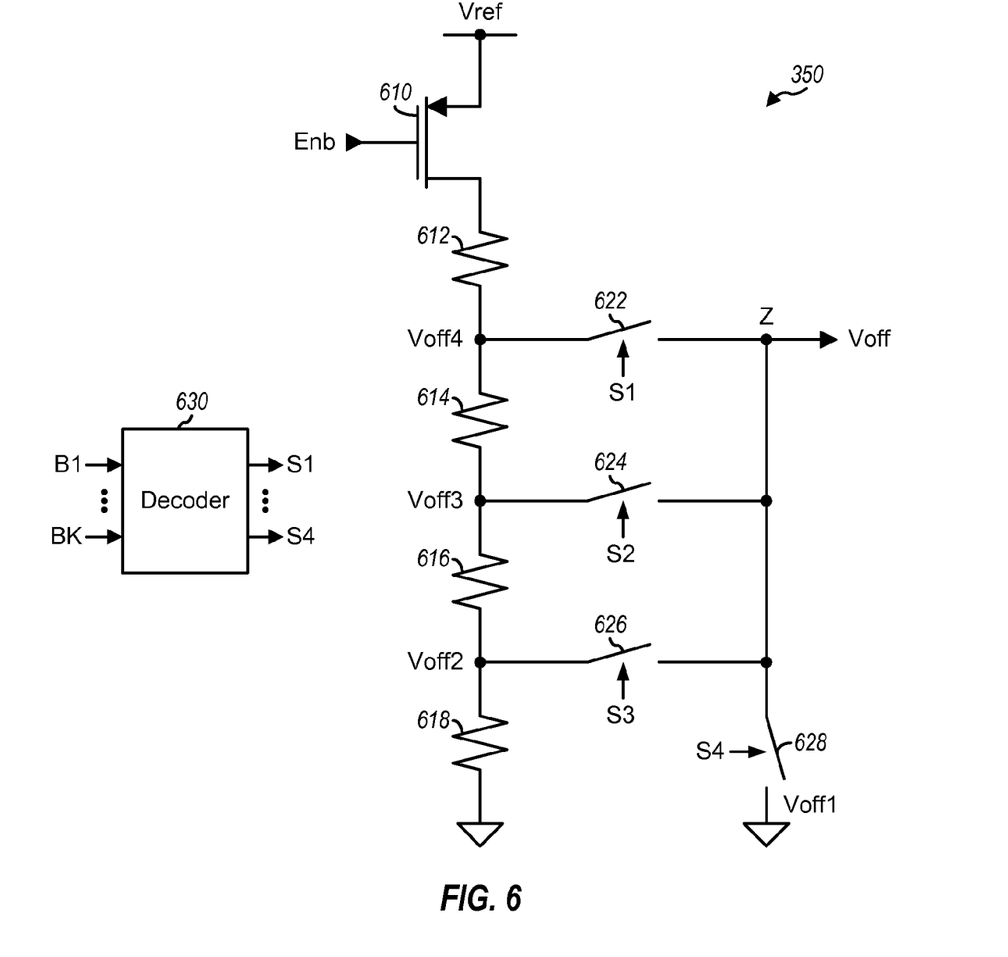
FIG. 6 shows a schematic diagram of an off voltage generator.

FIG. 6 shows a schematic diagram of an exemplary design of Voff voltage generator 350 in FIG. 3. Within Voff voltage generator 350, a PMOS transistor 610 has its source coupled to a reference voltage, Vref, and its gate receiving an enable signal, Enb. The Enb signal may be set to logic high to disable Voff voltage generator 350 or to logic low to enable Voff voltage generator 350. Resistors 612, 614, 616 and 618 are coupled in series and between the drain of PMOS transistor 610 and circuit ground. The bottom end of resistors 612, 614 and 616 provides Voff4, Voff3 and Voff2, respectively. Switches 622, 624 and 626 have one end coupled to node Z and the other end receiving Voff4, Voff3 and Voff2, respectively. A switch 628 is coupled between node Z and circuit ground. Switches 622, 624, 626 and 628 are opened and closed by S1, S2, S3 and S4 control signals, respectively.

A decoder 630 may receive the B1 through BK control signals for the K amplifier stages 310 in FIG. 3. Decoder 630 may generate the S1 through S4 control signals based on the B1 through BK control signals, which may be indicative of the output signal level.

FIG. 6 shows an exemplary design of Voff voltage generator 350, which sets the Voff voltage to one of four possible values. Resistors 612, 614, 616 and 618 may have suitably selected values to obtain the four desired Voff values. Voff voltage generator 350 may also be implemented with other exemplary designs.

In general, an apparatus may comprise multiple amplifier stages to amplify an input signal and provide an output signal, e.g., as shown in FIG. 3. The multiple amplifier stages may be coupled in parallel and may comprise at least one switchable amplifier stage. Each switchable amplifier stage may be operated in an on state or an off state and may comprise a gain transistor coupled to a cascode transistor. The gain transistor may amplify the input signal and provide an amplified signal in the on state and may not amplify the input signal in the off state. The cascode transistor may buffer the amplified signal and provide the output signal in the on state and may be disabled based on an off voltage in the off state. The off voltage may be greater than zero volts or may have one of multiple possible values. The off voltage may also be less than a threshold voltage of the cascode transistor.

At least one amplifier stage may be enabled whenever the apparatus is transmitting. The at least one switchable amplifier stage may be enabled or disabled to obtain a target output signal level. An inductor may be coupled between the outputs of all amplifier stages and a supply voltage. The output signal may then have a voltage swing below and above the supply voltage.

In one exemplary design, a first voltage generator may generate the off voltage based on an output signal level. The multiple possible values of the off voltage (which may include zero volts) may be associated with multiple ranges of output signal level.

The off voltage may be set to a value determined based on a range covering the current output signal level. In one exemplary design, the first voltage generator may receive at least one control signal for the at least one switchable amplifier stage and may generate the off voltage based on the at least one control signal. Each control signal may set a corresponding switchable amplifier stage to the on state or the off state. In one exemplary design, the first voltage generator may comprise multiple resistors coupled in series and providing the multiple possible values of the off voltage, e.g., as shown in FIG. 6.

In one exemplary design, each switchable amplifier stage may further comprise an inverter (as shown in FIG. 3) or a buffer (which may be composed of a cascade of two inverters) to receive a control signal for the switchable amplifier stage and provide a control voltage for the cascode transistor. The inverter/buffer may be coupled between an on voltage (e.g., Vdd or Von) to enable the cascode transistor and the off voltage. Each switchable amplifier stage may further comprise (i) a resistor coupled between the output of the inverter/buffer and the gate of the cascode transistor and (ii) a capacitor coupled between the gate of the cascode transistor and circuit ground. A second voltage generator may receive the output signal and generate the on voltage for the inverter/buffer in each switchable amplifier stage.

The gain transistor and the cascode transistor of each switchable amplifier stage may be implemented with NMOS transistors (as shown in FIG. 3), PMOS transistors, or other types of transistors. The off voltage and the on voltage may be set to different values for different types of transistors.

Figure 7:
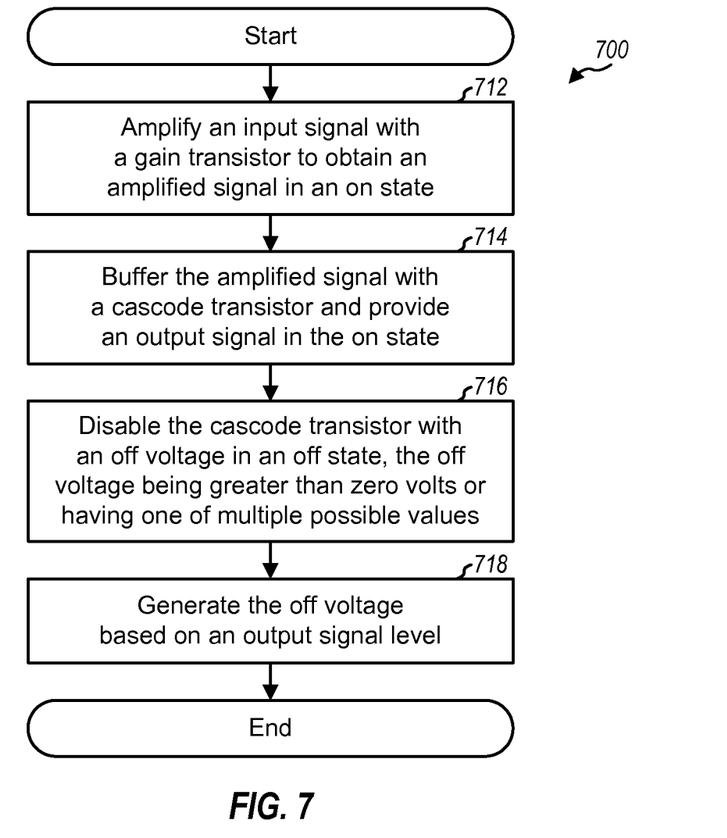
FIG. 7 shows a process for operating an amplifier.

FIG. 7 shows an exemplary design of a process 700 for operating an amplifier. An input signal may be amplified with a gain transistor to obtain an amplified signal in an on state (block 712). The amplified signal may be buffered with a cascode transistor to obtain an output signal in the on state (block 714). The cascode transistor may be disabled with an off voltage in an off state, with the off voltage being greater than zero volts or having one of multiple possible values (block 716).

In one exemplary design, the off voltage may be generated based on an output signal level (block 718). The off voltage may be set to zero volts if the output signal level is below a threshold or to a value greater than zero volts if the output signal level is greater than the threshold. A control voltage for the cascode transistor may be set to the off voltage in the off state or to an on voltage in the on state. The on voltage may be generated based on the output signal or may be set to a predetermined value, e.g., Vdd.

In one exemplary design, at least one of multiple amplifier stages coupled in parallel may be enabled, and remaining amplifier stages may be disabled. Each amplifier stage may comprise the gain transistor and the cascode transistor. The cascode transistor in each disabled amplifier stage may be disabled with the off voltage. The off voltage may be generated based on which at least one amplifier stage is enabled among the multiple amplifier stages.

The amplifier described herein may improve the reliability of the disabled transistors that may be coupled to the same output node as the enabled transistors. In particular, the gate of each disabled transistor may be coupled to a low Voff voltage (instead of circuit ground) when RF amplification by that transistor is not required. The Voff voltage may be programmable (e.g., through a serial bus interface) so that larger Voff values may be used for larger output signal levels, and vice versa, e.g., as shown in FIG. 5. Computer simulations were performed for the exemplary amplifier design shown in FIG. 3. The computer simulation showed negligible RF performance degradation (in terms of gain, power, linearity and noise) in higher output signal ranges where the Voff voltage is greater than 0V. The amplifier may thus improve reliability of the disabled transistors without sacrificing RF performance and leakage current.

The amplifier described herein may be implemented on an IC, an analog IC, an RFIC, a mixed-signal IC, an ASIC, a printed circuit board (PCB), an electronics device, etc. The amplifier may also be fabricated with various IC process technologies such as CMOS, NMOS, PMOS, bipolar junction transistor (BJT), bipolar-CMOS (BiCMOS), silicon germanium (SiGe), gallium arsenide (GaAs), etc.

An apparatus implementing the amplifier described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   multiple amplifier stages to amplify an input signal and provide an output signal, the multiple amplifier stages being coupled in parallel and comprising at least one switchable amplifier stage, each switchable amplifier stage being operated in an on state or an off state and comprising
   a gain transistor to amplify the input signal and provide an amplified signal in the on state and to not amplify the input signal in the off state, and
   a cascode transistor coupled to the gain transistor and to buffer the amplified signal and provide the output signal in the on state, the cascode transistor being disabled based on a programmable off voltage in the off state, the level of the programmable off voltage being at least partially dependent on the output signal.

2. The apparatus of claim 1, further comprising:
   a voltage generator to generate the off voltage based on an output signal level.

3. The apparatus of claim 2, the programmable off voltage being greater than zero volts or having one of multiple possible values being associated with multiple ranges of output signal level, and the off voltage being set to a value determined based on a range covering the output signal level.

4. The apparatus of claim 1, further comprising:
   a voltage generator to receive at least one control signal for the at least one switchable amplifier stage and to generate the off voltage based on the at least one control signal, each control signal setting a corresponding switchable amplifier stage to the on state or the off state.

5. The apparatus of claim 1, further comprising:
   a voltage generator comprising multiple resistors coupled in series and providing the multiple possible values of the off voltage.

6. The apparatus of claim 1, the multiple possible values of the off voltage comprising zero volts.

7. The apparatus of claim 1, the off voltage being less than a threshold voltage of the cascode transistor.

8. The apparatus of claim 1, each switchable amplifier stage further comprising:
   an inverter or a buffer to receive a control signal for the switchable amplifier stage and to provide a control voltage for the cascode transistor, the inverter or buffer being coupled between an on voltage to enable the cascode transistor and the off voltage to disable the cascode transistor.

9. The apparatus of claim 8, each switchable amplifier stage further comprising:
   a resistor coupled between an output of the inverter or buffer and a gate of the cascode transistor, and
   a capacitor coupled between the gate of the cascode transistor and circuit ground.

10. The apparatus of claim 8, further comprising:
    a voltage generator to receive the output signal and generate the on voltage for the inverter or buffer in each switchable amplifier stage.

11. The apparatus of claim 1, further comprising:
    an inductor coupled between outputs of the multiple amplifier stages and a supply voltage, the output signal having a voltage swing below and above the supply voltage.

12. The apparatus of claim 1, at least one of the multiple amplifier stages being enabled when the apparatus is transmitting.

13. The apparatus of claim 1, the at least one switchable amplifier stage being enabled or disabled to obtain a target output signal level.

14. An integrated circuit comprising:
    multiple amplifier stages to amplify an input signal and provide an output signal, the multiple amplifier stages being coupled in parallel and comprising at least one switchable amplifier stage, each switchable amplifier stage being operated in an on state or an off state and comprising
    a gain transistor to amplify the input signal and provide an amplified signal in the on state and to not amplify the input signal in the off state, and
    a cascode transistor coupled to the gain transistor and to buffer the amplified signal and provide the output signal in the on state, the cascode transistor being disabled based on a programmable off voltage in the off state, the level of the programmable off voltage at least partially dependent on the output signal.

15. The integrated circuit of claim 14, further comprising:
    a voltage generator to generate the off voltage based on an output signal level.

16. The integrated circuit of claim 14, the gain transistor and the cascode transistor comprising N-channel metal oxide semiconductor (NMOS) transistors or P-channel metal oxide semiconductor (PMOS) transistors.

17. A method comprising:
    amplifying an input signal with a gain transistor to obtain an amplified signal in an on state;
    buffering the amplified signal with a cascode transistor and providing an output signal in the on state; and
    disabling the cascode transistor with a programmable off voltage in an off state, the level of the programmable off voltage being at least partially dependent on the output signal.

18. The method of claim 17, further comprising:
    generating the off voltage based on an output signal level.

19. The method of claim 18, the generating the off voltage comprising:

setting the off voltage to zero volts if the output signal level is below a threshold, and setting the off voltage to a value greater than zero volts if the output signal level is greater than the threshold.

20. The method of claim 17, further comprising:

generating an on voltage based on the output signal; and setting a control voltage for the cascode transistor to the off voltage in the off state or to the on voltage in the on state.

21. The method of claim 17, further comprising:

enabling at least one of multiple amplifier stages coupled in parallel, each amplifier stage comprising the gain transistor and the cascode transistor; and disabling the cascode transistor in each disabled amplifier stage with the off voltage.

22. The method of claim 21, further comprising:

generating the off voltage based on which at least one amplifier stage is enabled among the multiple amplifier stages.

23. An apparatus comprising:

means for amplifying an input signal to obtain an amplified signal in an on state;

means for buffering the amplified signal and providing an output signal in the on state; and means for disabling the means for buffering with a programmable off voltage in an off state, the level of the programmable off voltage being at least partially dependent on the output signal.

24. The apparatus of claim 23, further comprising:

means for generating the off voltage based on an output signal level.

25. The apparatus of claim 24, the means for generating the off voltage comprising:

means for setting the off voltage to zero volts if the output signal level is below a threshold, and means for setting the off voltage to a value greater than zero volts if the output signal level is greater than the threshold.

* * * * *